US012752390B2

(12) United States Patent
Huang

(10) Patent No.: US 12,752,390 B2
(45) Date of Patent: Oct. 6, 2026

(54) OPTICAL THICKNESS CONTROL DURING A CHEMICAL MECHANICAL POLISHING PROCESS AND APPARATUS FOR EFFECTING THE SAME

(71) Applicant: Taiwan Semiconductor Manufacturing Company Limited, Hsinchu (TW)

(72) Inventor: Chun-Hsi Huang, Hsinchu City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 350 days.

(21) Appl. No.: 18/676,554

(22) Filed: May 29, 2024

(65) Prior Publication Data

US 2024/0308020 A1 Sep. 19, 2024

Related U.S. Application Data

(62) Division of application No. 17/206,183, filed on Mar. 19, 2021, now Pat. No. 12,059,769.

(51) Int. Cl.

*B24B 37/013* (2012.01)
*H10P 52/40* (2026.01)
*H10P 74/00* (2026.01)

(52) U.S. Cl.

CPC .......... *B24B 37/013* (2013.01); *H10P 52/402* (2026.01); *H10P 74/238* (2026.01)

(58) Field of Classification Search

CPC ....... B24B 49/16; B24B 37/013; B24B 37/00; H10P 52/402; H10P 74/238

See application file for complete search history.

(56) References Cited

U.S. PATENT DOCUMENTS

| | | | | |
|---|---|---|---|---|
| 2009/0280580 | A1* | 11/2009 | Manens | B24B 53/017 451/8 |
| 2014/0273752 | A1* | 9/2014 | Bajaj | B24B 49/18 451/6 |
| 2017/0355059 | A1* | 12/2017 | Benner | B24B 37/005 |
| 2019/0275632 | A1* | 9/2019 | Wiswell | B24B 37/013 |
| 2020/0094375 | A1* | 3/2020 | Tsai | B24B 49/16 |
| 2020/0164481 | A1* | 5/2020 | Lai | B24B 37/013 |
| 2021/0005479 | A1* | 1/2021 | Trojan | B24B 37/015 |
| 2021/0046602 | A1* | 2/2021 | Wu | B24B 37/015 |
| 2022/0097202 | A1* | 3/2022 | Pai | B24B 37/32 |

FOREIGN PATENT DOCUMENTS

| | | | |
|---|---|---|---|
| EP | 1066925 | A2 | 1/2001 |

* cited by examiner

*Primary Examiner* — Mohsen Ahmadi

(74) *Attorney, Agent, or Firm* — The Marbury Law Group, PLLC

(57) ABSTRACT

A substrate may be loaded onto a chemical mechanical polishing (CMP) apparatus, which includes a polishing pad and a wafer carrier that holds the substrate. The wafer carrier includes a backside plate, a wafer carrier frame, and at least one optical vertical displacement measurement unit that includes a respective laser source and a respective pixelated image sensor. A total reflection geometry is used to reflect a laser beam off a top surface of the backside plate. A polish rate or a polish thickness of a polished portion of the substrate may be measured at each location underneath at least one reflection point during the CMP process.

20 Claims, 12 Drawing Sheets

OPTICAL THICKNESS CONTROL DURING A CHEMICAL MECHANICAL POLISHING PROCESS AND APPARATUS FOR EFFECTING THE SAME

RELATED APPLICATIONS

This application is a divisional application of U.S. Application Ser. No. 17/206,183 entitled "Optical Thickness Control During a Chemical Mechanical Polishing Process and Apparatus for Effecting the Same," filed on Mar. 19, 2021, the entire contents of which are incorporated herein by reference for all purposes.

BACKGROUND

Chemical mechanical polishing processes are used to provide a planarization process during semiconductor manufacturing. Precise control of a polishing thickness and uniformity of the polish rate across a wafer are desired to provide a polished film having a uniform thickness distribution.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
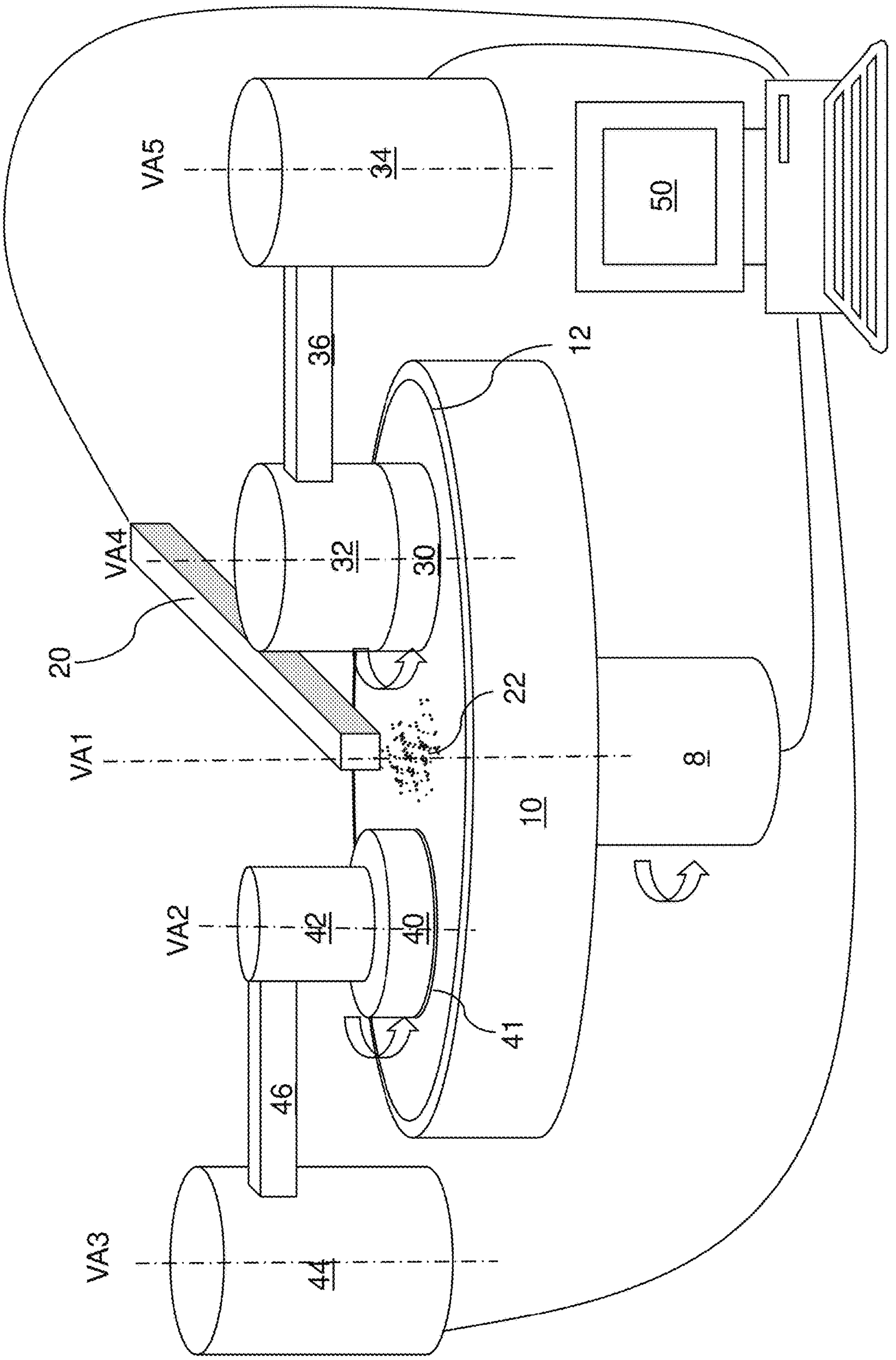
FIG. 1 is a schematic perspective view of a chemical mechanical polishing apparatus according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Chemical mechanical polishing (CMP) is used in semiconductor manufacturing to provide an abrasive planarization process that provides a highly planar surface. A CMP apparatus includes a rotating platen with a polishing pad thereupon, a wafer carrier configured to hold and press a wafer against a top surface of the polishing pad, and a slurry dispenser. A CMP apparatus may optionally include a pad conditioning unit containing a pad conditioning disk. The various aspects of the present disclosure are described in detail herebelow.

FIG. 1 is a schematic perspective view of a chemical mechanical polishing apparatus according to an embodiment of the present disclosure. Referring to FIG. 1, a chemical mechanical polishing (CMP) apparatus according to an embodiment of the present disclosure includes a polishing pad 12 located on a top surface of a platen 10, a wafer carrier 40 configured to hold a substrate 41 upside down, a slurry dispenser 20 configured to dispense slurry 22 over the top surface of the polishing pad 12, and a pad conditioning unit (30, 32) that may be used to condition the top surface of the polishing pad 12.

The platen 10 may have a generally cylindrical shape, and may have a circular top surface that may be large enough to accommodate the polishing pad 12. The polishing pad 12 may have a circular shape with a diameter that is at least twice the diameter of the substrate 41. For example, in embodiments in which the diameter of the substrate 41 is 300 mm, the diameter of the polishing pad 12 may be at least 600 mm. In embodiments in which the diameter of the substrate 41 is 450 mm, the diameter of the polishing pad 12 may be at least 900 mm. Generally, the ratio of the diameter of the polishing pad 12 to the diameter of the substrate 41 may be in a range from 2 to 6, such as from 2.5 to 4, although greater or lesser ratios may be used. The polishing pad 12 may include asperities and pores that define the pad texture. The asperities and pores may be arranged into unit cells that are repeated across the polishing pad and to provide uniform pressure across the substrate 41 during polishing.

The platen 10 may be configured to rotate around a vertical axis (VA1) passing through the geometrical center of the platen 10. For example, a platen motor assembly 8 may be provided underneath the platen 10 to provide a rotational motion to the platen 10 around the vertical axis (VA1) passing through the geometrical center of the platen 10. The platen 10 may be configured to provide a rotational speed in a range from 10 revolutions per minute to 240 revolutions per minute, although faster or slower rotational speed may be used.

The wafer carrier 40 may be configured to hold the substrate 41 on a bottom surface thereof, and to press the substrate 41 onto the top surface of the polishing pad 12. In one embodiment, the wafer carrier 40 may include a vacuum chuck configured to provide suction to the backside of the substrate 41. In one embodiment, differential suction pressures may be applied across different backside areas of the substrate 41. For example, the suction pressure applied to the center portion of the substrate 41 may be different from the suction pressure applied to the peripheral portion of the substrate 41 to provide uniform polishing rate across the entire area of the front side of the substrate 41 that contacts the polishing pad 12. In one embodiment, the wafer carrier 40 may include a retaining ring having an annular shape and configured to hold the substrate 41 therein so that the substrate 41 does not slide out from underneath the wafer carrier 40.

A polishing head 42 may be provided over the wafer carrier 40. The polishing head 42 may include a rotation mechanism that provides rotation to the wafer carrier 40. In some embodiments, a gimbal mechanism may be provided between the rotation mechanism and the wafer carrier 40 so that the wafer carrier 40 tilts in a manner that provides maximum physical contact between the entire front surface of the substrate 41 and the polishing pad 12. The combination of the polishing head 42 and the wafer carrier 40 constitutes a wafer polishing unit (40, 42) that positions and rotates the substrate 41 in a manner that induces polishing of material portions on the front side of the substrate 41 through abrasion caused by sliding contact with the top surface of the polishing pad 12.

In one embodiment, the substrate 41 and the wafer carrier 40 may rotate around the vertical axis (VA2) passing through the geometrical center of the wafer carrier 40. A polishing pivot pillar structure 44 may be affixed to a frame (not shown) of the CMP apparatus such that the polishing pivot pillar structure 44 may rotate around a vertical axis (VA3) passing through the geometrical center of the polishing pivot pillar structure 44. The vertical axis (VA3) passing through the geometrical center of the polishing pivot pillar structure 44 may be stationary relative to the frame of the CMP apparatus.

A polishing arm 46 mechanically connects the polishing head 42 to the polishing pivot pillar structure 44. Thus, upon rotation of the polishing pivot pillar structure 44 around the vertical axis (VA3) passing through the geometrical center of the polishing pivot pillar structure 44, the polishing arm 46 may rotate around the vertical axis (VA3) passing through the geometrical center of the polishing pivot pillar structure 44. The polishing head 42 may move around the vertical axis (VA3) passing through the geometrical center of the polishing pivot pillar structure 44 over the polishing pad 12. Lateral movement of the wafer polishing unit (40, 42) over the polishing pad 12 may enhance uniformity of polish rate across the substrate 41 during the CMP process.

The slurry dispenser 20 may be configured to dispense the slurry 22 over the top surface of the polishing pad 12. The slurry 22 may include any slurry known in the art, such as commercially available slurries for chemical mechanical polishing processes.

The pad conditioning unit (30, 32) may be used to precondition the polishing pad 12 prior to, and/or during, the CMP process that is used to polish material portions from the front surface of the substrate 41 that contacts the top surface of the polishing pad 12. In one embodiment, the pad conditioning unit (30, 32) may include a pad conditioning disk 30 and a conditioning head 32 that is configured to hold the pad conditioning disk 30. The pad conditioning disk 30 includes an abrasive bottom surface that may precondition the top surface of the polishing pad 12. Typically, the abrasive bottom surface of the pad conditioning disk 30 embeds abrasive particles such as diamond particles. The pad conditioning disk 30 may be attached to the conditioning head 32 in a manner that provides rotation of the pad conditioning disk around a vertical axis (VA4) passing through the geometrical center of the pad conditioning disk 30 without falling out from the conditioning head 32.

A conditioner pivot pillar structure 34 may be affixed to a frame (not shown) of the CMP apparatus such that the conditioner pivot pillar structure 34 may rotate around a vertical axis (VA5) passing through the geometrical center of the conditioner pivot pillar structure 34. The vertical axis passing through the geometrical center of the conditioner pivot pillar structure 34 may be stationary relative to the frame of the CMP apparatus.

A pad conditioner arm 36 mechanically connects the conditioning head 32 to the conditioner pivot pillar structure 34. A pad conditioner arm 36 mechanically connects the conditioning head 32 to the conditioner pivot pillar structure 34. Thus, upon rotation of the conditioner pivot pillar structure 34 around the vertical axis (VA5) passing through the geometrical center of the conditioner pivot pillar structure 34, the pad conditioner arm 36 may rotate around the vertical axis (VA5) passing through the geometrical center of the conditioner pivot pillar structure 34. The conditioning head 32 may move around the vertical axis (VA5) passing through the geometrical center of the conditioner pivot pillar structure 34 over the polishing pad 12. Lateral movement of the pad conditioning unit (30, 32) over the polishing pad 12 may enhance uniformity of the surface condition of the polishing pad 12 after the pad pre-conditioning process.

The CMP apparatus in accordance with the various embodiments may include a process controller 50 electrically connected to electrical components that control movement of various mechanical parts of the CMP apparatus. For example, the process controller 50 may be electrically connected to, and may be configured to control operation of, each of the platen motor assembly 8, the polishing pivot pillar structure 44, the wafer polishing unit (40, 42), the conditioner pivot pillar structure 34, the pad conditioning unit (30, 32), and the slurry dispenser 20. For example, the process controller 50 may control the rotational speed of the platen 10, the polishing pivot pillar structure 44, the wafer carrier 40, the conditioner pivot pillar structure 34, and the pad conditioning disk 30, and may control the location of the slurry dispensation point and the rate of slurry dispensation.

Generally, the CMP apparatus according to various embodiments may include a polishing pad 12 located on a top surface of a platen 10 configured to rotate around a vertical axis VA1 passing through the platen 10, a wafer carrier 40 that holds a substrate 41 and facing the polishing pad 12, a slurry dispenser 20 configured to dispense slurry 22 over the polishing pad 12, and a process controller 50 configured to control operation of components within the wafer carrier 40 and other components of the CMP apparatus.

Figure 2A:
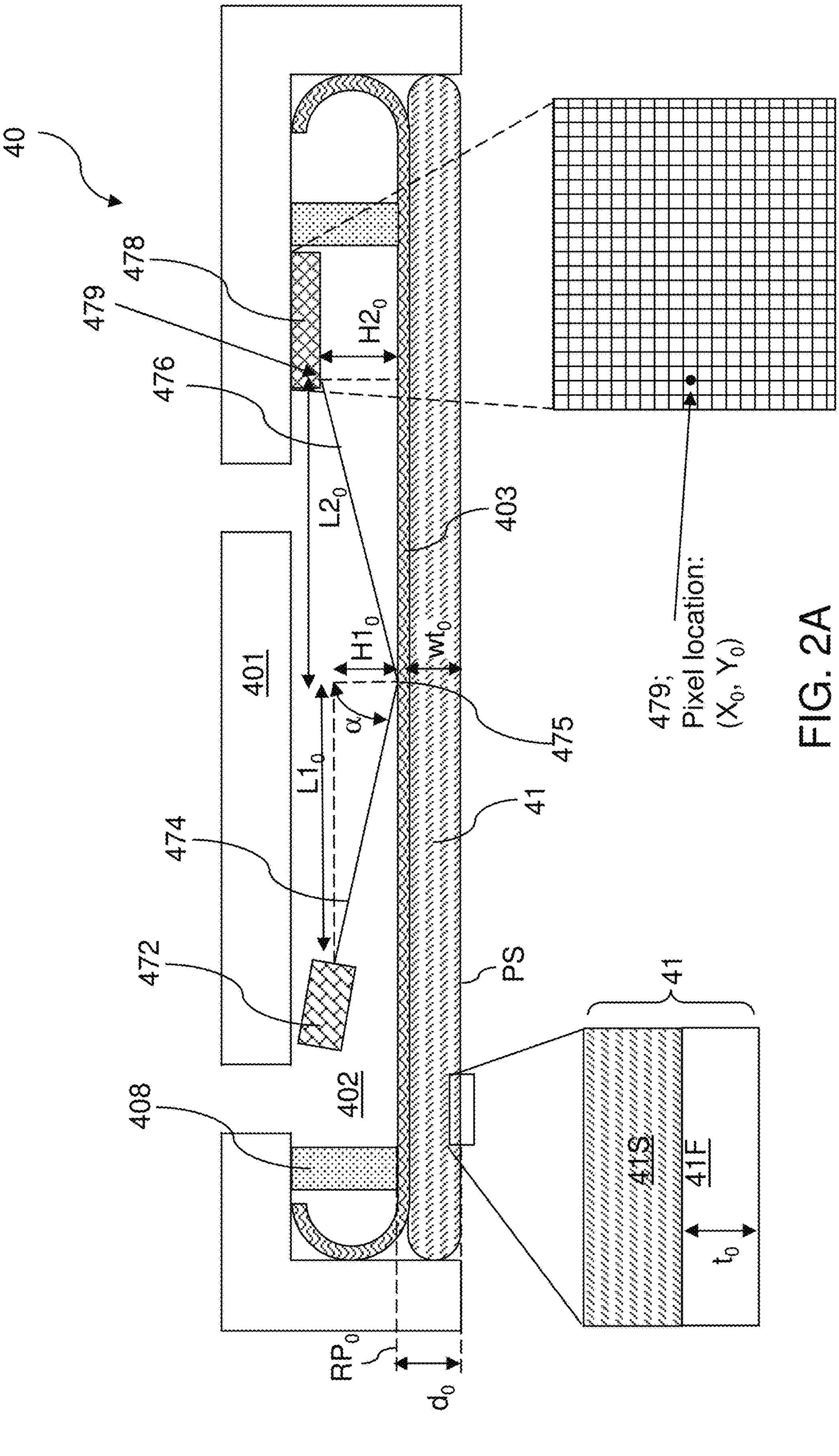
FIGS. 2A, 2B, and 2C are sequential vertical cross-sectional views of a wafer carrier during a chemical mechanical polishing process according to an embodiment of the present disclosure. A first inset in each of FIGS. 2A, 2B, and 2C illustrates a vertical cross-sectional view of a substrate under polishing. A second inset in each of FIGS. 2A, 2B, and 2C illustrates locations of a reflected laser beam on a pixelated image sensor.
Figure 2B:
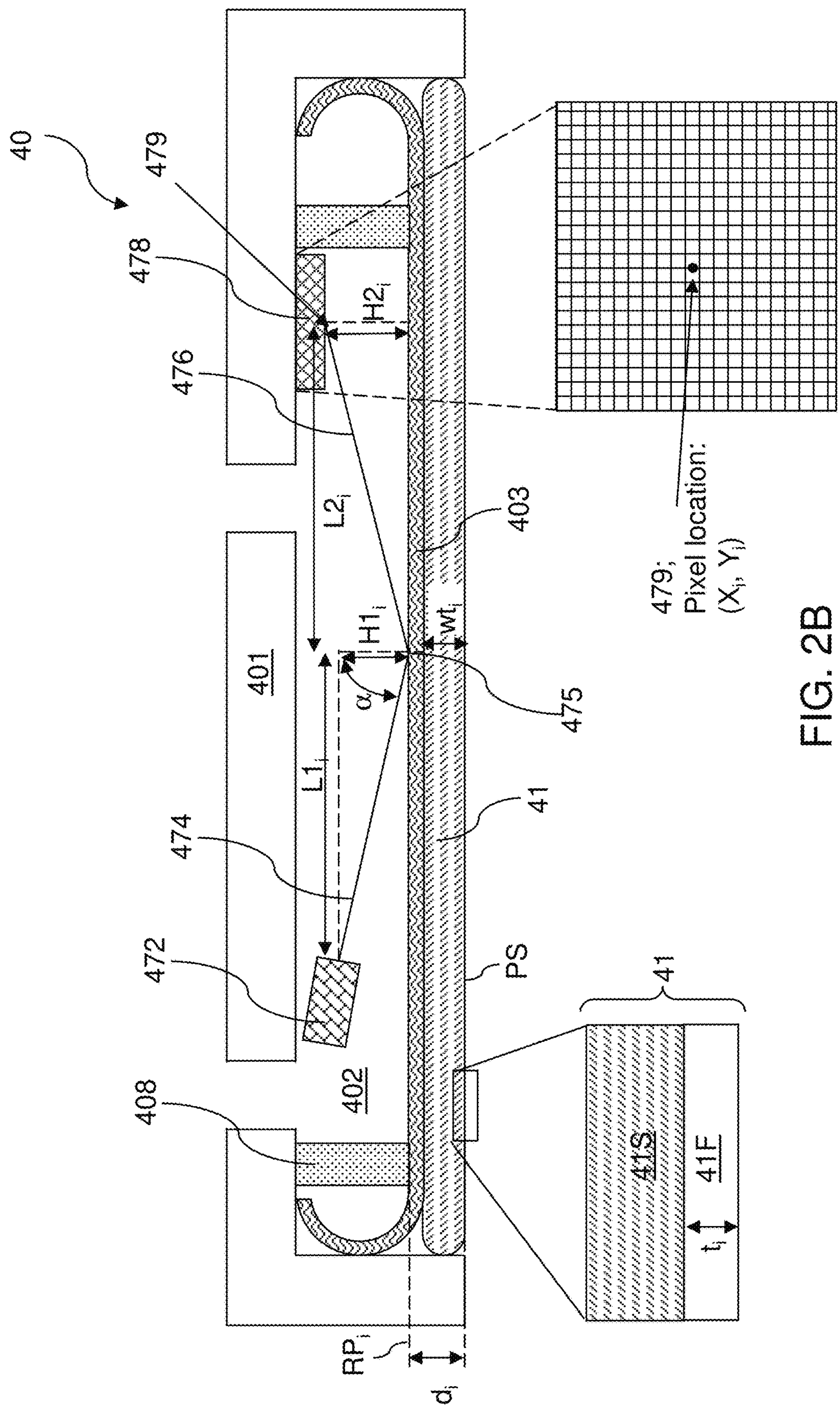
Figure 2C:
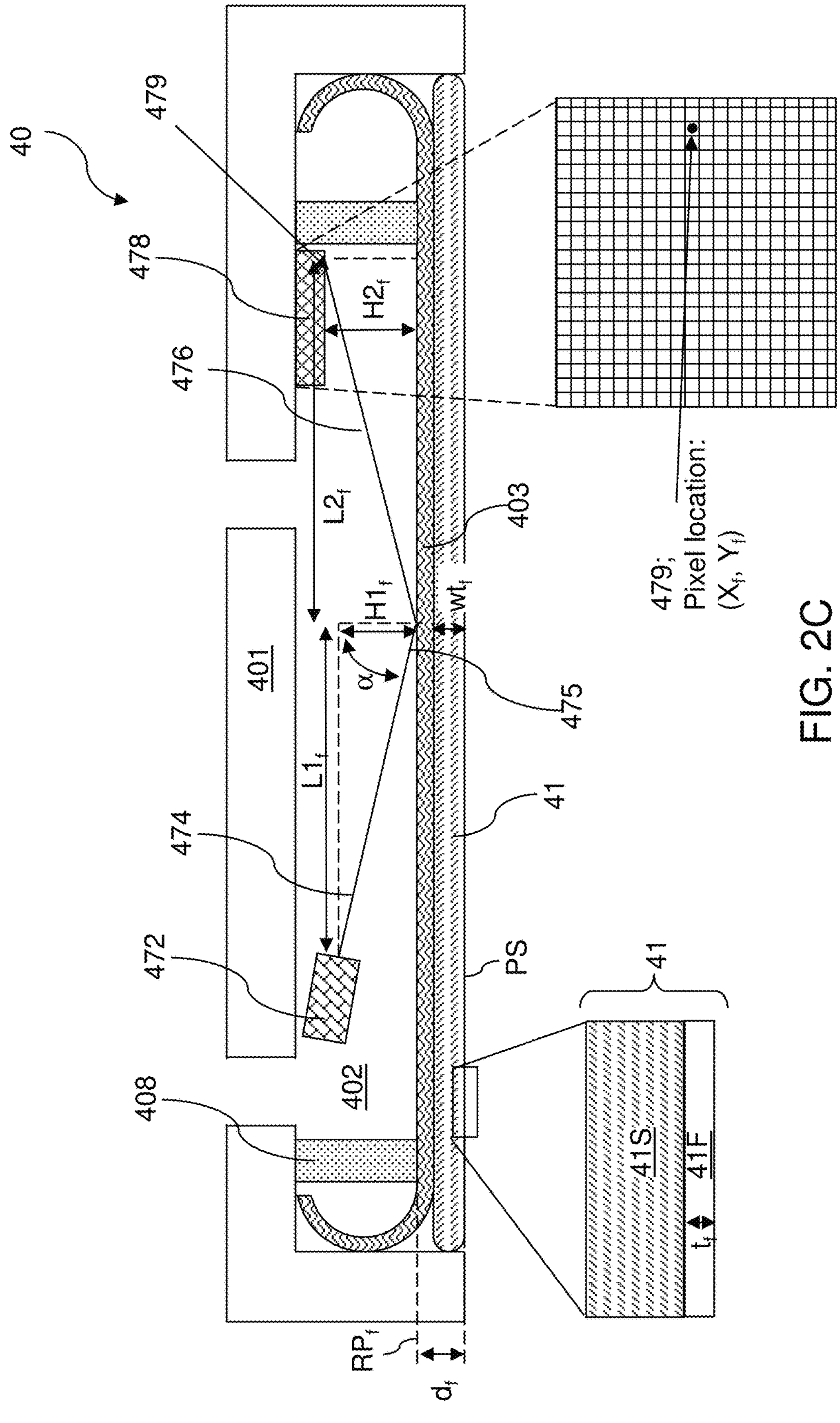

FIGS. 2A, 2B, and 2C are sequential vertical cross-sectional views of a wafer carrier 40 during a chemical mechanical polishing process according to an embodiment of the present disclosure. A first inset in each of FIGS. 2A, 2B, and 2C illustrates a vertical cross-sectional view of the substrate 41 under polishing. A second inset in each of FIGS. 2A, 2B, and 2C illustrates pixel locations 479 of a reflected laser beam 476 on a pixelated image sensor 478.

Referring to FIG. 2A, a wafer carrier 40 and a substrate 41 are illustrated at a processing step immediately before commencement of a CMP process. The wafer carrier 40 comprises a backside plate 403 configured to press the substrate 41 onto a top surface of the polishing pad 12, and a wafer carrier frame 401 that holds the backside plate 403 with a cavity 402 between a top surface (i.e., a backside surface) of the backside plate 403 and an inner surface of the wafer carrier frame 401. In one embodiment, the wafer carrier frame 401 comprises a tubular portion (i.e., a hollow cylindrical portion) and a top plate portion adjoined to a top periphery of the tubular portion. The backside plate 403 may be configured to press the substrate 41 toward the polishing pad 12 such that a predominant fraction of the bottom surface portion of the substrate 41 may be flush with a horizontal plane including an annular bottom surface of the tubular portion of the wafer carrier frame 401. A predominant fraction refers to a fraction that is at least 50% of an entirety. The cavity 402 may be provided between the top surface of the backside plate 403 and a bottom surface of the top plate portion of the wafer carrier frame 401, and may be laterally surrounded by the tubular portion of the wafer carrier frame 401.

According to an aspect of the present disclosure, the wafer carrier 40 comprises at least one optical vertical displacement measurement unit (472, 478) that includes a respective laser source 472 configured to emit an incident laser beam 474 onto the top surface (i.e., the backside surface) of the backside plate 403 at an angle of incidence $\alpha$ that induces total reflection at a respective reflection point 475 and includes a respective pixelated image sensor 478 configured to detect a pixel location ($X_i$, $Y_i$) of a reflected laser beam 476 derived from the incident laser beam 474 by total reflection at the respective reflection point 475. For example, the pixel location ($X_i$, $Y_i$) of the reflected laser beam 476 may be an initial pixel location ($X_0$, $Y_0$) before the CMP process commences.

A pixelated image sensor 478 refers to an image sensor including an array of pixels, which may be a two-dimensional array of pixels or a one-dimensional array of pixels. A pixelated image sensor 478 allows digitization of a center of a detected light beam as coordinates within the array of pixels. In embodiments in which the pixelated image sensor 478 includes a two-dimensional array of pixels, the location of the center of the detected light beam may be characterized by a Cartesian coordinate representing the pixel location (Xi, $Y_i$) of the detected light beam. In one embodiment, each of the at least one pixelated image sensor 478 comprises a complementary metal-oxide-semiconductor (CMOS) image sensor including a two-dimensional array of photodetector cells.

In one embodiment, each of the at least one reflection point 475 has an angle of incidence $\alpha$ in a range from 75 degrees to 89.9999 degrees, such as from 85 degrees to 89.9 degrees and/or from 88 degrees to 89.5 degrees. In one embodiment, each of the incident laser beam 474 may have a wavelength in a range from 400 nm to 800 nm.

Each reflection point 475 may be located within a respective initial reflection plane $RP_0$. The initial reflection plane $RP_0$ may be vertically spaced from the horizontal plane including a polishing surface PS by a respective initial vertical spacing do. Each initial vertical spacing do may be a sum of the initial wafer thickness wt0 and the thickness of the backside plate 403. The initial wafer thickness $wt_0$ is the thickness of the substrate 41 directly underneath the reflection point 475. The substrate 41 may include a base substrate portion 41S and a polished film portion 41F that may be polished during a planarization process and supported by the base substrate portion 41S. The initial thickness of the polished film portion 41F is herein referred to as an initial film thickness $t_0$, which may be, for example, in a range from 100 nm to 10,000 nm, such as from 300 nm to 3,000 nm, although lesser and greater thicknesses may also be used.

The lateral distance between the emission point of the laser source 472 and the reflection point 475 for a given optical vertical displacement measurement unit (472, 478) is herein referred to as an incident-path lateral dimension. The initial value for the incident-path lateral dimension prior to the CMP process is herein referred to as an initial incident-path lateral dimension $L1_0$. The vertical distance between the emission point of the laser source 472 and the reflection point 475 for a given optical vertical displacement measurement unit (472, 478) is herein referred to as an incident-path vertical dimension. The initial value for the incident-path vertical dimension prior to the CMP process is herein referred to as an initial incident-path vertical dimension $H1_0$. The ratio between the initial incident-path lateral dimension $L1_0$ and the initial incident-path vertical dimension $H1_0$ is the same as the tangent of the angle of incidence $\alpha$.

The angle of reflection is the same as the angle of incidence $\alpha$. The lateral distance between the pixel location 479 of the reflected laser beam 476 and the reflection point 475 for a given optical vertical displacement measurement unit (472, 478) is herein referred to as a reflection-path lateral dimension. The initial value for the reflection-path lateral dimension prior to the CMP process is herein referred to as an initial reflection-path lateral dimension $L2_0$. The vertical distance between the emission point of the pixel location 479 and the reflection point 475 for a given optical vertical displacement measurement unit (472, 478) is herein referred to as a reflection-path vertical dimension. The initial value for the reflection-path vertical dimension prior to the CMP process is herein referred to as an initial reflection-path vertical dimension $H2_0$. The ratio between the initial reflection-path lateral dimension $L2_0$ and the initial reflection-path vertical dimension $H2_0$ is the same as the tangent of the angle of incidence $\alpha$.

In an illustrative example, the diameter of the substrate 41 may be in a range from 100 mm to 450 mm, and the sum of the initial incident-path lateral dimension $L1_0$ and the initial reflection-path lateral dimension $L2_0$ may be in a range from 50 mm to 400 mm, such as from 80 mm to 350 mm. Each of the initial incident-path vertical dimension $H1_0$ and the initial reflection-path vertical dimension $H2_0$ may be in a range from 1 mm to 10 mm, such as from 2 mm to 5 mm, although lesser and greater dimensions may also be used.

The pixelated image sensor 478 may be mounted such that the apertures of the photodetectors face downward. Thus, the face of the pixelated image sensor 478 faces downward. In other words, the array of photodetectors within the pixelated image sensor 478 may be oriented such that the array of photodetectors may detect radiation that propagates upward. The array of photodetectors may include an array of lenses having a convex curvature (such as an array of hemispherical lenses or an array of dome-shaped lenses) or an array of pyramidal lenses to provide angled surfaces for the reflected laser beam 476. In one embodiment, the periodicity of the array of lenses within the array of photodetectors may be the same as the periodicity of the pixels within the pixelated image sensor 478. Alternatively, the periodicity of the array of lenses within the array of photodetectors may be commensurate with the periodicity of the pixels within the pixelated image sensor 478. For example, the periodicity of the pixels within the pixelated image sensor 478 may be an integer multiple of the periodicity of the array of lenses within the array of photodetectors.

Referring to FIG. 2B, the wafer carrier 40 and the substrate 41 are illustrated during the CMP processing step. As the polished film portion 41F is thinned during the CMP processing step, the initial film thickness $t_0$ of the polished film portion 41F changes to an in-process film thickness $t_i$, which is less than the initial film thickness $t_0$. The angle of reflection α remains the same. The backside plate 403 may push the substrate 41 under polishing toward the polishing pad 12 such that the polishing PS remains flush with the annular bottom surface of the tubular portion of the wafer carrier frame 401.

Each reflection point 475 shifts downward vertically and shifts away from the laser source 472 due to the downward movement of the backside surface of the backside plate 403 during the CMP processing step. Each incident laser beam 474 impinges on a respective reflection point 475 at the same angle of incidence α, and is reflected to generate a respective reflected laser beam 476 and impinges on a respective pixelated image sensor 478. The in-process pixel location $(X_i, Y_i)$ of a reflected laser beam 476 shifts from the initial pixel location $(X_0, Y_0)$ along a horizontal direction, which is the direction of the horizontal component of a vector from the laser source 472 to the pixelated image sensor 478.

Each reflection point 475 may be located within a respective in-process reflection plane $RP_i$. The in-process reflection plane $RP_i$ may be vertically spaced from the horizontal plane including the polishing surface PS by a respective in-process vertical spacing $d_i$. Each in-process vertical spacing $d_i$ may be a sum of the in-process wafer thickness $wt_i$ and the thickness of the backside plate 403 at a respective measurement point. The in-process wafer thickness $wt_i$ is the thickness of the substrate 41 directly underneath the reflection point 475. The in-process thickness of the polished film portion 41F gradually changes from the initial thickness to a final thickness during the CMP processing step.

The in-process value for the incident-path lateral dimension during the CMP process is herein referred to as an in-process incident-path lateral dimension $L\mathbf{1}_i$. The in-process value for the incident-path vertical dimension prior to the CMP process is herein referred to as an in-process incident-path vertical dimension $H\mathbf{1}_i$. The ratio between the in-process incident-path lateral dimension $L\mathbf{1}_i$ and the in-process incident-path vertical dimension $H\mathbf{1}_i$ is the same as the tangent of the angle of incidence α.

The in-process value for the reflection-path lateral dimension during the CMP process is herein referred to as an in-process reflection-path lateral dimension $L\mathbf{2}_i$. The in-process value for the reflection-path vertical dimension during the CMP process is herein referred to as an in-process reflection-path vertical dimension $H\mathbf{2}_i$. The ratio between the in-process reflection-path lateral dimension $L\mathbf{2}_i$ and the in-process reflection-path vertical dimension $H\mathbf{2}_i$ is the same as the tangent of the angle of incidence α.

For each unit thickness change in the in-process wafer thickness $wt_i$, the in-process incident-path vertical dimension $H\mathbf{1}_i$ and the in-process reflection-path vertical dimension $H\mathbf{2}_i$ change by the same distance. For each unit change in the in-process incident-path vertical dimension $H\mathbf{1}_i$, the in-process incident-path lateral dimension $L\mathbf{1}_i$ changes by the product of the unit change in the in-process incident-path vertical dimension $H\mathbf{1}_i$ times the tangent of the angle of incidence α. For each unit change in the in-process reflection-path vertical dimension $H\mathbf{2}_i$, the in-process reflection-path lateral dimension $L\mathbf{2}_i$ changes by the product of the unit change in the in-process reflection-path vertical dimension $H\mathbf{2}_i$ times the tangent of the angle of incidence α. The total lateral shift in the pixel location 479 of the reflected laser beam 476 (i.e., the location of the point at which the reflected laser beam 476 impinges onto the pixelated image sensor 478) is the sum of the changes in the in-process incident-path lateral dimension $L\mathbf{1}_i$ and the in-process reflection-path lateral dimension $L\mathbf{2}_i$. Thus, the total lateral shift in the pixel location 479 of the reflected laser beam 476 is twice the product of the change in the in-process wafer thickness $wt_i$ and the tangent of the angle of incidence α.

As discussed above, the angle of incidence α may be in a range from 75 degrees to 89.9999 degrees, such as from 85 degrees to 89.9 degrees and/or from 88 degrees to 89.5 degrees. The tangent of the angle of incidence α may be in a range from 3.73 to 572,957, such as from 11.43 to 573.0 and/or from 28.64 to 114.6. Thus, the thickness change in the substrate 41 along a vertical direction may be magnified by a factor of twice the tangent of the angle of incidence α along a horizontal direction in the pixel location 479 of the reflected laser beam 476 on the pixelated image sensor 478. For example, a change in the thickness of the substrate 41 on the order of 100 nm may be amplified as a change in a range from 700 nm to 100 mm in the lateral position of the impinging point of the reflected laser beam on the pixelated image sensor 478. Thus, embodiments of the present disclosure provide amplification in measurement of the thickness change in the substrate 41 during the CMP processing step.

Referring to FIG. 2C, the wafer carrier 40 and the substrate 41 are illustrated at the end of the CMP processing step. As the polished film portion 41F is thinned during the CMP processing step, the initial film thickness $t_0$ of the polished film portion 41F changes to a final film thickness $t_f$, which is less than the initial film thickness $t_0$. The final film thickness $t_f$ may be finite if a remaining portion of a polished film portion 41F is present, or may be zero if the entirety of the polished film portion 41F is removed. The angle of reflection α remains the same. The backside plate 403 pushes the substrate 41 under polishing toward the polishing pad 12 such that the polishing PS remains flush with the annular bottom surface of the tubular portion of the wafer carrier frame 401.

Each reflection point 475 is shifted downward vertically and is shifted away from the laser source 472 due to the downward movement of the backside surface of the backside plate 403 during the CMP processing step. Each incident laser beam 474 impinges on a respective reflection point 475 at the same angle of incidence α, and is reflected to generate a respective reflected laser beam 476 and impinges on a respective pixelated image sensor 478. The final pixel location ($X_f$, $Y_f$) of a reflected laser beam 476 shifts from the initial pixel location ($X_0$, $Y_0$) along the horizontal direction, i.e., along the direction of the horizontal component of a vector from the laser source 472 to the pixelated image sensor 478.

Each reflection point 475 may be located within a respective final reflection plane $RP_f$. The final reflection plane $RP_f$ may be vertically spaced from the horizontal plane including the polishing surface PS by a respective final vertical spacing $d_f$. Each final vertical spacing $d_f$ may be a sum of the final wafer thickness $wt_f$ and the thickness of the backside plate 403 at a respective measurement point. The final wafer thickness wtf is the thickness of the substrate 41 directly underneath the reflection point 475 as measured at each measurement point.

The final value for the incident-path lateral dimension during the CMP process is herein referred to as a final incident-path lateral dimension $L\mathbf{1}_f$. The final value for the incident-path vertical dimension prior to the CMP process is herein referred to as a final incident-path vertical dimension $H\mathbf{1}_f$. The ratio between the final incident-path lateral dimension $L\mathbf{1}_f$ and the final incident-path vertical dimension $H\mathbf{1}_f$ is the same as the tangent of the angle of incidence α.

The final value for the reflection-path lateral dimension during the CMP process is herein referred to as a final reflection-path lateral dimension $L\mathbf{2}_f$. The final value for the reflection-path vertical dimension during the CMP process is herein referred to as a final reflection-path vertical dimension $H\mathbf{2}_f$. The ratio between the final reflection-path lateral dimension $L\mathbf{2}_f$ and the final reflection-path vertical dimension $H\mathbf{2}_f$ is the same as the tangent of the angle of incidence α.

According to an aspect of the present disclosure, the process controller 50 may be configured to automatically run an image analyzer program that determines a location of a center point of each of the at least one reflected laser beam 476. For example, a reflected laser beam 476 may impinge over a plurality of pixels within a pixelated image sensor 478 due to elongation of a reflected laser beam 476 along the propagation direction over the surface of the pixelated image sensor 478. In this embodiment, determination of the center portion of each of the at least one reflected laser beam 476 may be effected by determining a location of an image pixel having highest detected beam intensity, or by fitting an intensity distribution curve to a measured beam intensity distribution.

According to an aspect of the present disclosure, the process controller 50 may be configured to run an automated program that determines a polish rate (i.e., $d(wt_i)/dt$)) or a polish thickness (i.e., $wt_i - wt_0$) of the bottom surface portion (i.e., the polished film portion 41F) of the substrate 41 at each location underneath the at least one reflection point 475 based on a change in the pixel location 479 of each reflected laser beam 476.

Referring collectively to FIGS. 1-2C and according to various embodiments of the present disclosure, a CMP method is provided. The method comprises loading a substrate 41 onto a CMP apparatus, wherein the CMP apparatus comprises a polishing pad 12 located on a top surface of a platen 10 configured to rotate around a vertical axis VA1 passing through the platen 10, a wafer carrier 40 that holds the substrate 41, and a slurry dispenser 20 configured to dispense slurry 22 over the polishing pad 12, wherein the wafer carrier 40 comprises a backside plate 403 configured to press the substrate 41 on a top surface of the polishing pad 12, a wafer carrier frame 401 that holds the backside plate 403 with a cavity 402 between a top surface of the backside plate 403 and an inner surface of the wafer carrier frame 401, and at least one optical vertical displacement measurement unit (472, 478) that includes a respective laser source 472 configured to emit an incident laser beam 474 onto the top surface of the backside plate 403 at an angle of incidence α that induces total reflection at a respective reflection point 475 and includes a respective pixelated image sensor 478 configured to detect a pixel location {479; ($X_i$, $Y_i$)} of a reflected laser beam 476 derived from the incident laser beam 474 by total reflection at the respective reflection point 475. The method comprises polishing a bottom surface portion of the substrate 41 by applying downforce to the backside plate 403 while the substrate 41 contacts a top surface of the polishing pad 12 and while the platen 10 rotates. The method comprises determining the polish rate (i.e., $d(wt_i)/dt$)) or a polish thickness (i.e., $wt_i - wt_0$) of the bottom surface portion (i.e., the polished film portion 41F) of the substrate 41 at each location underneath the at least one reflection point 475 while polishing the bottom surface portion of the substrate 41 based on a change in the pixel location 479 of each of the at least one reflected laser beam 476.

In one embodiment, each of the at least one pixelated image sensor 478 comprises a complementary metal-oxide-semiconductor (CMOS) image sensor including a two-dimensional array of photodetector cells.

A process controller 50 may be provided, which is configured to automatically run an image analyzer program that determines a location of a center point of each of the at least one reflected laser beam 476 by determining a location of an image pixel having highest detected beam intensity or by fitting an intensity distribution curve to a measured beam intensity distribution.

In one embodiment, the CMP method comprises determining the polish rate (i.e., $d(wt_i)/dt$)) of the bottom surface portion (i.e., the polished film portion 41F) of the substrate 41 underneath each of the at least one reflection point 475 while polishing the bottom surface portion of the substrate 41 based on a measured rate of change in the pixel locations 479 of each of the at least one reflected laser beam 476.

In one embodiment, the CMP method comprises determining the polish thickness (i.e., $wt_i - wt_0$) of the bottom surface portion of the substrate underneath each of the at least one reflection point while polishing the bottom surface portion (i.e., the polished film portion 41F) of the substrate 41 based on a measured cumulative change in the pixel locations 479 of each of the at least one reflected laser beam 476.

Figure 3:
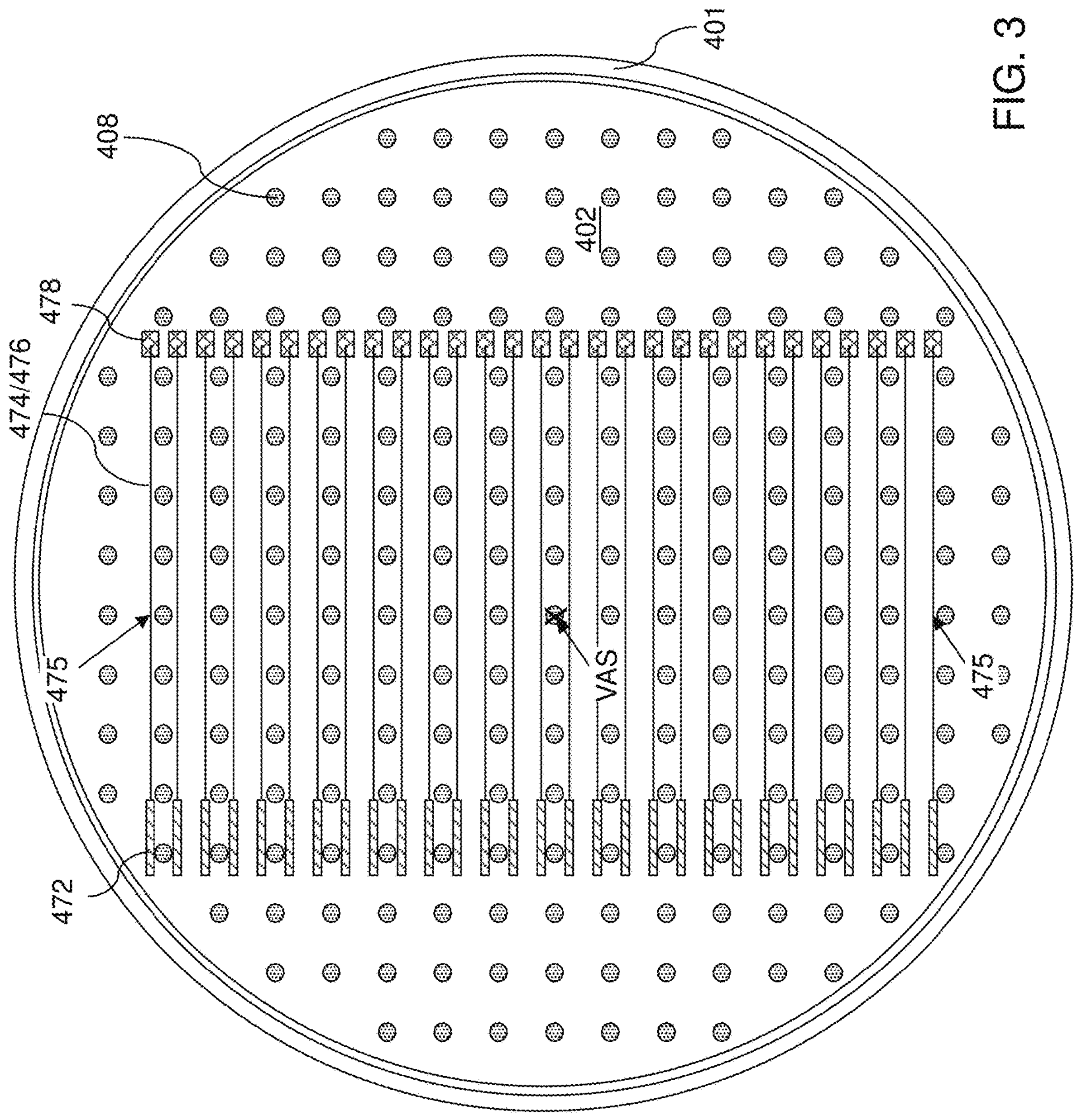
FIG. 3 is a semi-transparent schematic top-down view of the wafer carrier according to an embodiment of the present disclosure.

FIG. 3 is a semi-transparent schematic top-down view of the wafer carrier according to an embodiment of the present disclosure. According to an embodiment of the present disclosure, the at least one optical vertical displacement measurement unit (472, 478) comprises a plurality of optical vertical displacement measurement units (472, 478) configured to generate a plurality of reflection points 475 located at different radial distances from a vertical axis VAS passing through a geometrical center of the substrate 41. The range of the radial distances from the vertical axis VAS passing through the geometrical center of the substrate 41 may be in a range from 0% to 95%, such as from 0% to 90% of the radius of the substrate 41. The polish rate of the substrate 41 may be monitored at multiple points located at different radial distances from the vertical axis VAS passing through the geometrical center of the substrate 41 during the CMP processing step.

In one embodiment, an array of optical vertical displacement measurement units (472, 478) may be provided within the wafer carrier 40. In one embodiment, the array of optical vertical displacement measurement units (472, 478) may comprise a one-dimensional periodic array of optical vertical displacement measurement units (472, 478)

In one embodiment, the CMP apparatus comprises a process controller 50 configured to determine the polish rate (i.e., $d(wt_i)/dt$)) or a polish thickness (i.e., $wt_i-wt_0$) of the bottom surface portion (i.e., the polished film portion 41F) of the substrate 41 at each location underneath the plurality of reflection points 475 while polishing the bottom surface portion of the substrate 41 based on changes in pixel locations 479 of the plurality of reflected laser beams 476 within a respective pixelated image sensor 478 selected from a plurality of pixelated image sensors 478.

According to an aspect of the present disclosure, the CMP apparatus comprises a plurality of downforce adjustment elements 408 located at different radial distances from the vertical axis VAS passing through the geometrical center of the substrate 41. Each of the downforce adjustment elements 408 may be a mechanical structure configured to apply vertical pressure against the bottom surface of the top plate portion of the wafer carrier frame 401 and against the top surface of the backside plate 403. For example, each of the downforce adjustment elements 408 may comprises a spring-loaded stepper configured to change the overall vertical dimension based on an input from the process controller 50. Generally, the downforce adjustment elements 408 may comprise any electromechanical mechanism that generates vertical pressure against the top plate portion of the wafer carrier frame 401 and against the top surface of the backside plate 403 based on a control signal from the process controller 50. In one embodiment, the downward adjustment elements 408 may be arranged as a rectangular array, a hexagonal array, or any other array that provide distribution of the downward adjustment elements 408 across the entire area of the top surface of the backside plate 403.

According to an aspect of the present disclosure, the CMP method of the present disclosure may comprise locally increasing the downforce at a radial distance at which the polish rate or the polish thickness of the bottom surface portion of the substrate 41 is below average (i.e., below the average of all measured polish rates or below the average of all polish thickness), and locally decreasing the downforce at a radial distance at which the polish rate or the polish thickness of the bottom surface portion of the substrate 41 is above average. In one embodiment, the process controller 50 may be configured to determine a magnitude of a downforce component that each of the plurality of downforce adjustment elements 408 locally applies to the backside plate 403 based on radial distribution of the polish rate or the polish thickness of the bottom surface portion of the substrate 41 (as calculated by the rate of change or the total displace of the pixel locations 479 of reflected laser beams 476 on pixelated image sensors 478).

Figure 4A:
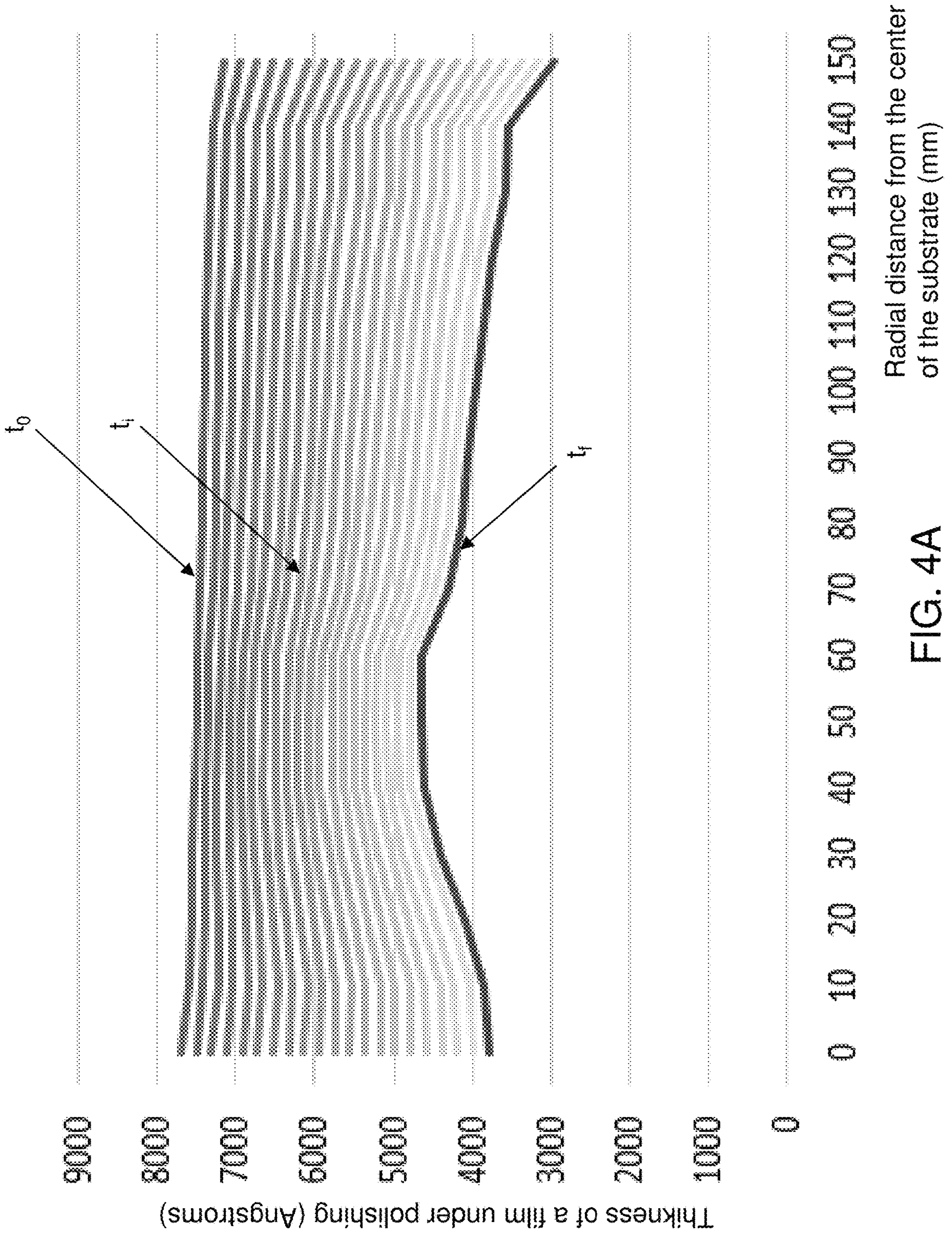
FIG. 4A is a graph illustrating a radial distribution of a thickness of a film under polishing within a comparative exemplary structure during a comparative exemplary chemical mechanical polishing process.

FIG. 4A is a graph illustrating a radial distribution of a thickness of a film under polishing within a comparative exemplary structure during a comparative exemplary chemical mechanical polishing process. The initial film thickness t0 is measured across the substrate 41 prior to the CMP process. The in-process film thickness ti is calculated based on a change in the pixel location 479 of the reflected laser beams 476 using the geometry illustrated in FIG. 2B. The final film thickness tf is measured after the CMP process. Uniform downforce is used during the CMP process, and thus, no adjustment is made to the downforce adjustment elements 408. In other words, the process controller 50 does not use any feedback mechanism for locally adjusting the downforce through the downforce adjustment elements 408.

Figure 4B:
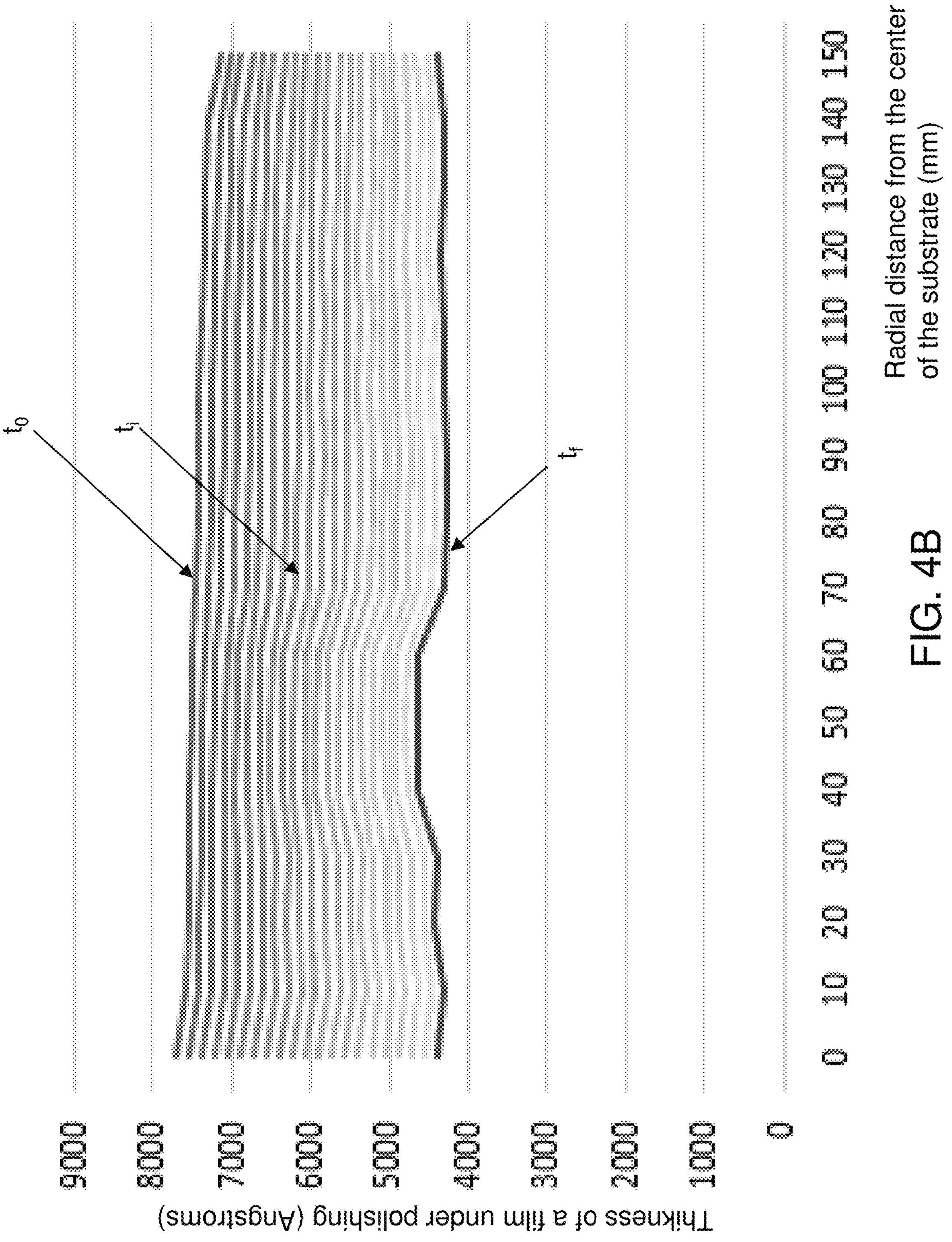
FIG. 4B is a graph illustrating a radial distribution of a thickness of a film under polishing with an exemplary structure during a chemical mechanical polishing process according to an embodiment of the present disclosure.

FIG. 4B is a graph illustrating a radial distribution of a thickness of a film under polishing with an exemplary structure during a chemical mechanical polishing process according to an embodiment of the present disclosure. The initial film thickness t0 is measured across the substrate 41 prior to the CMP process. The in-process film thickness ti is calculated based on a change in the pixel location 479 of the reflected laser beams 476 using the geometry illustrated in FIG. 2B. The final film thickness tf is measured after the CMP process. Local downforce adjustment is used during the CMP process. In other words, the process controller 50 generates control signals for locally adjusting the downforce through the downforce adjustment elements 408. Specifically, if the measured polish rate is below average within a radial distance range, the downforce generated by the downforce adjustment elements 408 located within such a radial distance range is increased to locally increase the polish rate within the radial distance range. Conversely, if the measured polish rate is above average within a radial distance range, the downforce generated by the downforce adjustment elements 408 located within such a radial distance range is decreased to locally increase the polish rate within the radial distance range. Use of the downforce adjustment elements 408 provides a more uniform distribution in the final thickness tf as shown in FIG. 4B compared to the distribution in the final thickness tf as shown in FIG. 4A.

Figure 5A:
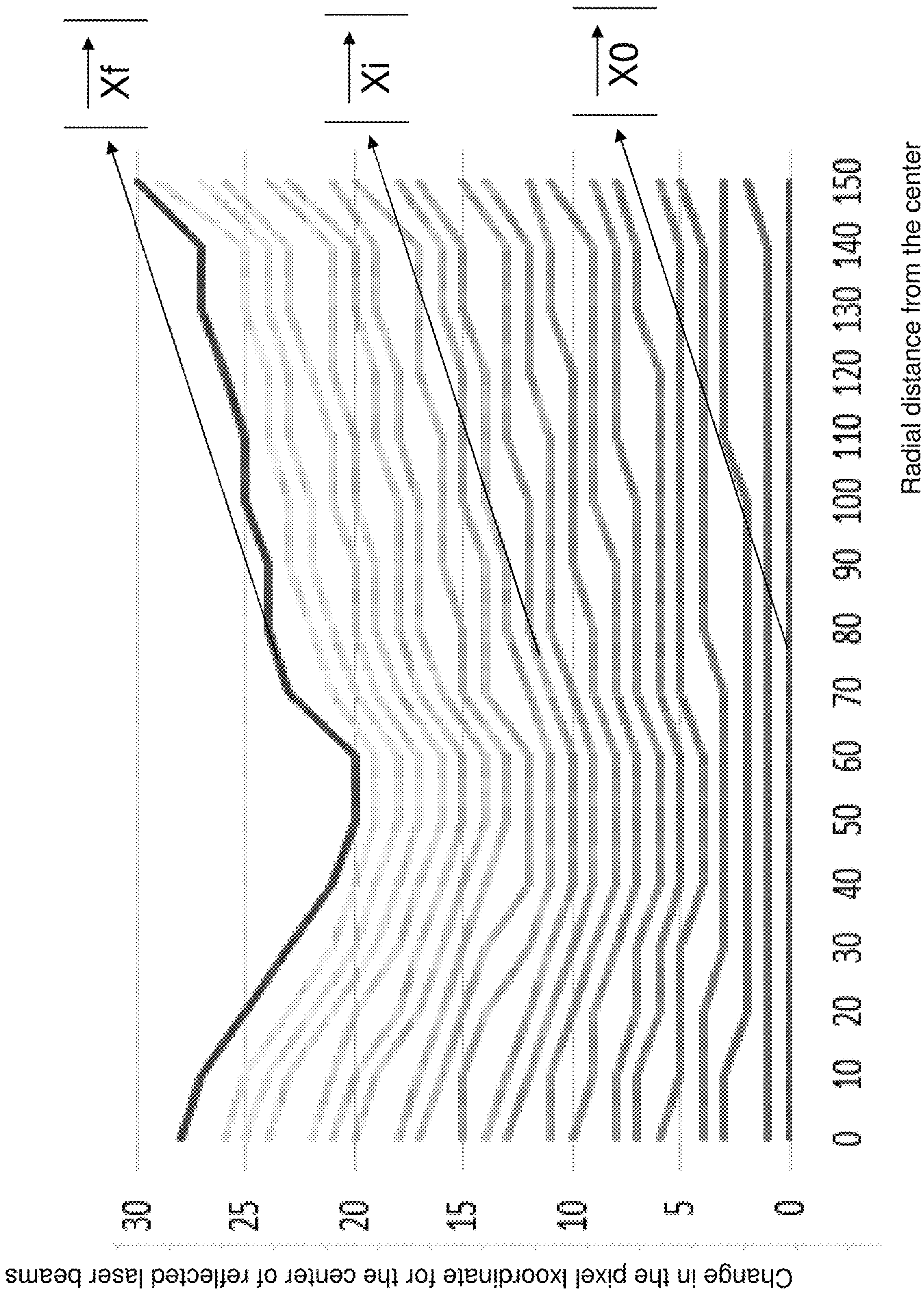
FIG. 5A is a graph illustrating lateral shift distances for reflected laser beams as a function of a radial distance from a geometrical center of a substrate in case downforce adjustment is not made according to an embodiment of the present disclosure.

FIG. 5A is a graph illustrating lateral shift distances for reflected laser beams as a function of a radial distance from a geometrical center of a substrate in case downforce adjustment is not made according to an embodiment of the present disclosure. Uniform downforce is used during the CMP process, and thus, no adjustment is made to the downforce adjustment elements 408 as in the embodiment illustrated in FIG. 4A. In other words, the process controller 50 does not use any feedback mechanism for locally adjusting the downforce through the downforce adjustment elements 408.

The in-process displacement vector $\overrightarrow{Xi}$ refers to the vector representing the distance (as measured in the total number of pixel) between the in-process pixel location ($X_i$, $Y_i$) of the reflected laser beams 476 in the geometry illustrated in FIG. 2B and the initial pixel position ($X_0$, $Y_0$) of the reflected laser beams 476 in the geometry illustrated in FIG. 2A. The initial displacement vector $\overrightarrow{X0}$ is the vector representing the displacement vector prior to initiating the CMP process, which is equal to a zero vector by definition. The final displacement vector $\overrightarrow{Xf}$ refers to the vector representing the displacement vector after the CMP process, which represents the distance (as measured in the total number of pixel) between the final pixel location ($X_f$, $Y_f$) of the reflected laser beams 476 in the geometry illustrated in FIG. 2C and the initial pixel position ($X_0$, $Y_0$) of the reflected laser beams 476 in the geometry illustrated in FIG. 2A. The magnitude of the various vectors are plotted in FIG. 5A.

Figure 5B:
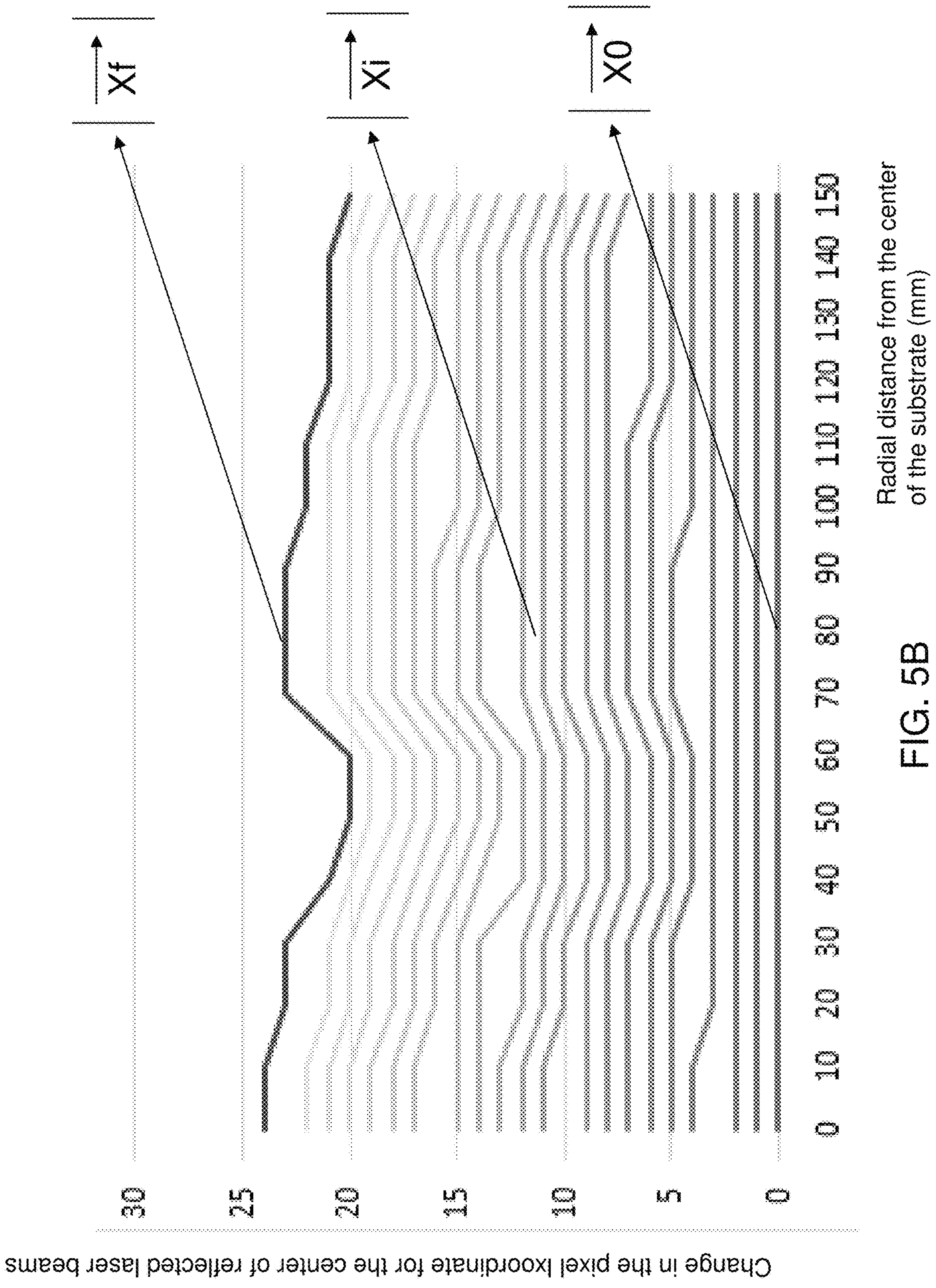
FIG. 5B is a graph illustrating lateral shift distance for reflected laser beams as a function of a radial distance from a geometrical center of a substrate in case downward force adjustment is made according to an embodiment of the present disclosure.

FIG. 5B is a graph illustrating lateral shift distance for reflected laser beams as a function of a radial distance from a geometrical center of a substrate in case downward force adjustment is made according to an embodiment of the present disclosure. Local downforce adjustment is used during the CMP process as in the embodiment illustrated in FIG. 4B. In other words, the process controller 50 generates control signals for locally adjusting the downforce through the downforce adjustment elements 408. Specifically, if the measured polish rate is below average within a radial distance range, the downforce generated by the downforce adjustment elements 408 located within such a radial distance range is increased to locally increase the polish rate within the radial distance range. Conversely, if the measured polish rate is above average within a radial distance range, the downforce generated by the downforce adjustment elements 408 located within such a radial distance range is decreased to locally increase the polish rate within the radial distance range.

The magnitudes of the in-process displacement vector $\overrightarrow{Xi}$, the initial displacement vector $\overrightarrow{X0}$, and the final displacement vector $\overrightarrow{Xf}$, as measured with multiple optical vertical displacement measurement units (472, 478), are plotted in FIG. 5B. Use of the downforce adjustment elements 408 provides a more uniform distribution in the magnitude of the final displacement vectors $\overrightarrow{Xf}$ which corresponds to the reduction in the range of the variations in the final thickness tf as shown in FIG. 4B.

Figure 6:
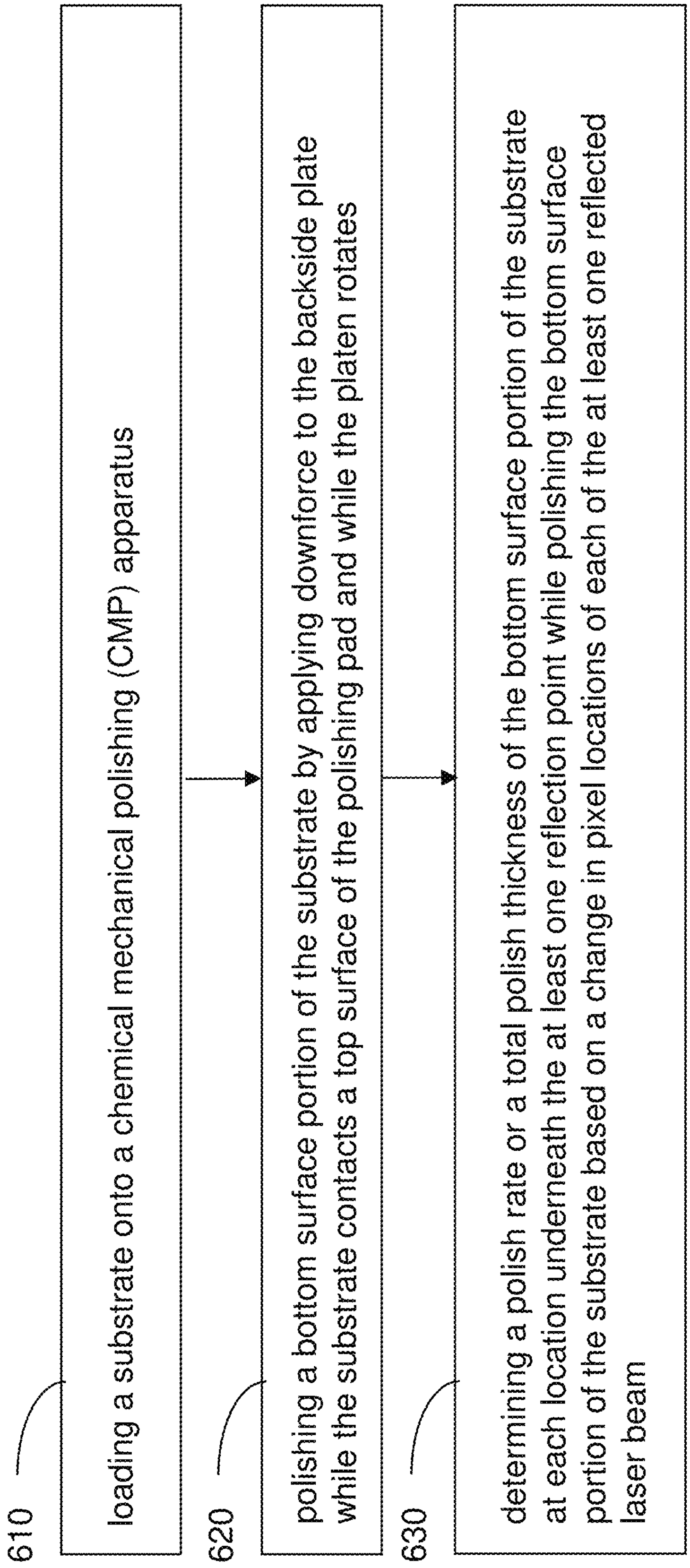
FIG. 6 is a process flow diagram illustrating a first exemplary chemical mechanical polishing process according to an embodiment of the present disclosure.

FIG. 6 is a process flow diagram illustrating a first exemplary chemical mechanical polishing process according to an embodiment of the present disclosure. Referring collectively to FIGS. 1-5B and step 610, a chemical mechanical polishing (CMP) method includes a step of loading a substrate 41 onto a chemical mechanical polishing (CMP) apparatus. The CMP apparatus comprises a polishing pad 12 located on a top surface of a platen 10 configured to rotate around a vertical axis VA1 passing through the platen 10, a wafer carrier 40 that holds the substrate 41, and a slurry dispenser 20 configured to dispense slurry 22 over the polishing pad 12. The wafer carrier 40 comprises a backside plate 403 configured to press the substrate 41 onto a top surface of the polishing pad 12, a wafer carrier frame 401 that holds the backside plate 403 with a cavity 402 between a top surface of the backside plate 403 and an inner surface of the wafer carrier frame 401, and at least one optical vertical displacement measurement unit (472, 478) that includes a respective laser source 472 configured to emit an incident laser beam 474 onto the top surface of the backside plate 403 at an angle of incidence α that induces total reflection at a respective reflection point 475 and includes a respective pixelated image sensor 478 configured to detect a pixel location 479 of a reflected laser beam 476 derived from the incident laser beam 474 by total reflection at the respective reflection point 475.

Referring collectively to FIGS. 1-5B and step 620, the CMP method includes a step of polishing a bottom surface portion (such as the polished film portion 41F) of the substrate 41 by applying downforce to the backside plate 403 while the substrate 41 contacts a top surface of the polishing pad 12 and while the platen 10 rotates.

Referring collectively to FIGS. 1-5B and step 630, the CMP method comprises the step of determining a polish rate (i.e., $d(wt_i)/dt$)) or a polish thickness (i.e., $wt_i-wt_0$) of the bottom surface portion (i.e., the polished film portion 41F) of the substrate 41 at each location underneath the respective reflection point 475 while polishing the bottom surface portion of the substrate 41 based on a change in the pixel location 479 of each of the respective reflected laser beam 476.

Figure 7:
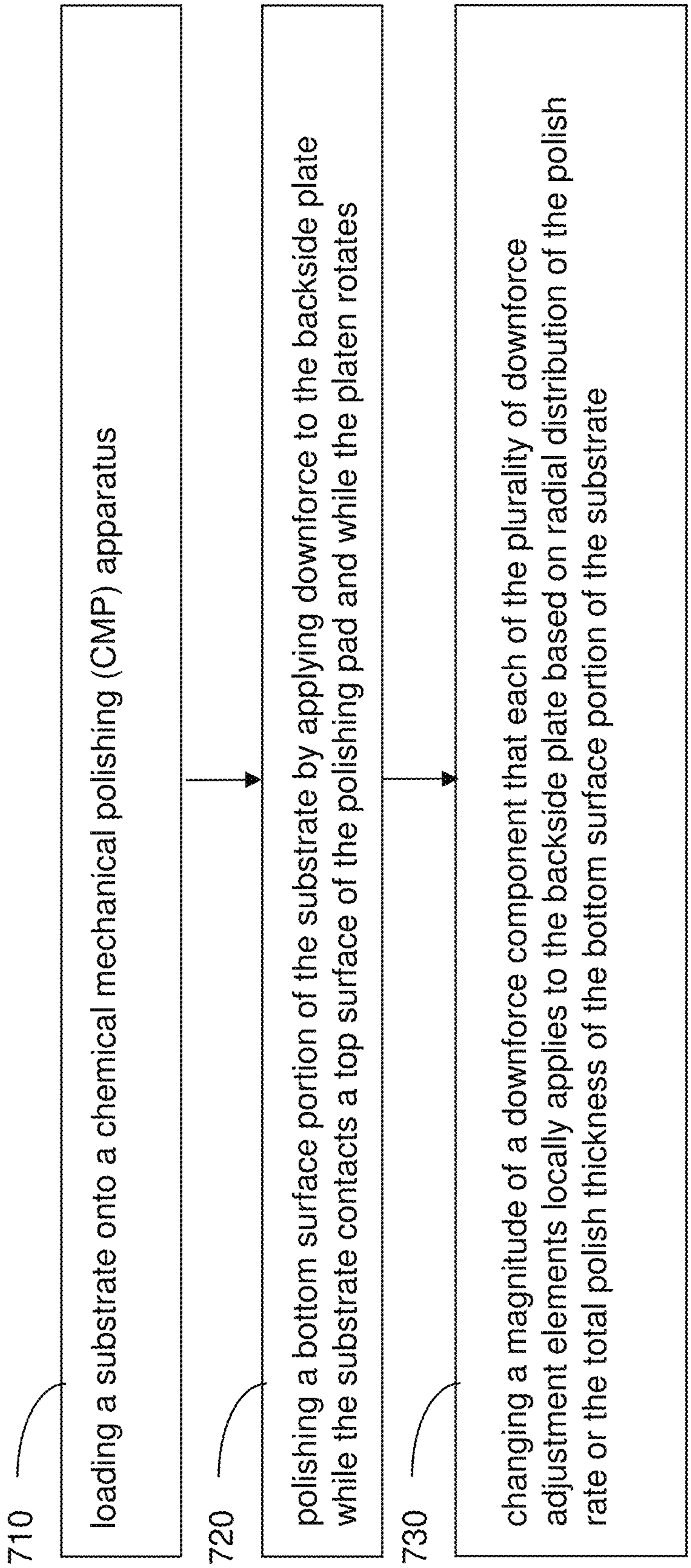
FIG. 7 is a process flow diagram illustrating a second exemplary chemical mechanical polishing process according to an embodiment of the present disclosure.

FIG. 7 is a process flow diagram illustrating a second exemplary chemical mechanical polishing process according to an embodiment of the present disclosure.

Figure 8:
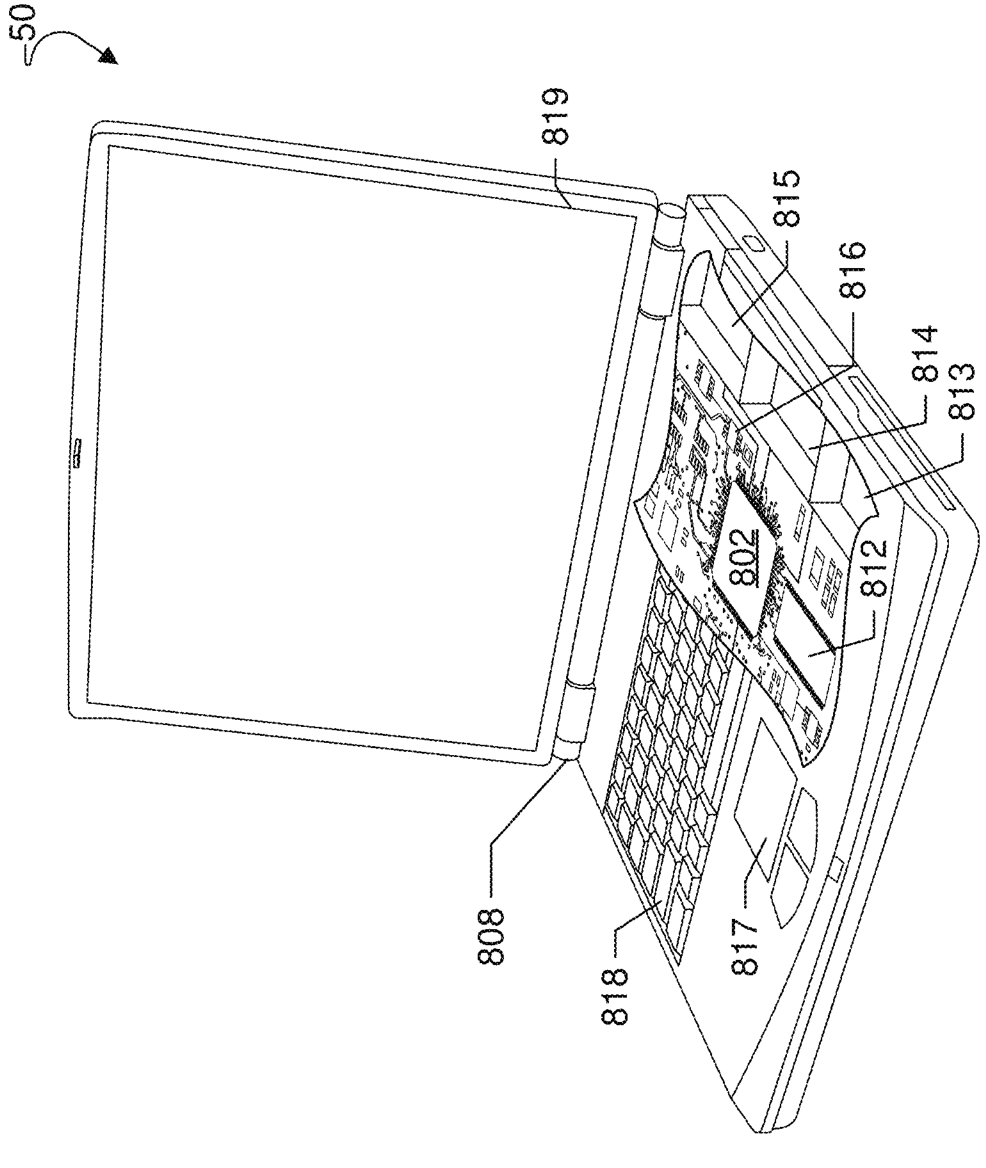
FIG. 8 is a component block diagram illustrating an example processor controller suitable for use with the various embodiments.

Various embodiments (including, but not limited to, embodiments described above with reference to FIGS. 1-5B) may be implemented in a wide variety of process controllers 50 an example of which is illustrated in FIG. 8. Many process controllers may include a touchpad touch surface 817 that serves as the process controller's 50 pointing device, and thus may receive drag, scroll, and flick gestures similar to those implemented on computing devices equipped with a touch screen display and described above. A process controller 50 will typically include a processor 802 coupled to volatile memory 812 and a large capacity nonvolatile memory, such as a disk drive 813 of Flash memory. Additionally, the process controller 50 may have one or more antenna 808 for sending and receiving electromagnetic radiation that may be connected to a wireless data link and/or cellular telephone transceiver 816 coupled to the processor 802. The process controller 50 may also include a floppy disc drive 814 and a compact disc (CD) drive 815 coupled to the processor 802. In a notebook configuration, the computer housing includes the touchpad 817, the keyboard 818, and the display 819 all coupled to the processor 802. Other configurations of the computing device may include a computer mouse or trackball coupled to the processor (e.g., via a USB input) as are well known, which may also be used in conjunction with the various embodiments.

Referring collectively to FIGS. 1-5B and step 710, a chemical mechanical polishing (CMP) method is provided. The method comprises loading a substrate 41 onto a chemical mechanical polishing (CMP) apparatus. The CMP apparatus comprises a polishing pad 12 located on a top surface of a platen 10 configured to rotate around a vertical axis VA1 passing through the platen 10, a wafer carrier 40 that holds the substrate 41, a slurry dispenser 20 configured to dispense slurry 22 over the polishing pad 12, and a process controller 50 configured to control operation of components within the wafer carrier 40, wherein the wafer carrier 40 comprises a backside plate 403 configured to press the substrate 41 on a top surface of the polishing pad 12, a wafer carrier frame 401 that holds the backside plate 403 with a cavity 402 between a top surface of the backside plate 403 and an inner surface of the wafer carrier frame 401, a plurality of downforce adjustment elements 408 located at different radial distances from a vertical axis VAS passing through a geometrical center of the substrate 41, a plurality of optical vertical displacement measurement units (472, 478) that includes a respective laser source 472 configured to emit an incident laser beam 474 onto the top surface of the backside plate 403 at an angle of incidence α that induces total reflection at a respective reflection point 475 located at different radial distances from the vertical axis VAS passing through the geometrical center of the substrate 41 and includes a respective pixelated image sensor 478 configured to detect a pixel location 479 of a respective reflected laser beam 476 derived from the incident laser beam 474 by total reflection at the respective reflection point 475.

Referring collectively to FIGS. 1-5B and step 720, the CMP method comprises a step of polishing a bottom surface portion of the substrate 41 by applying downforce to the backside plate 403 while the substrate 41 contacts a top surface of the polishing pad 12 and while the platen 10 rotates.

Referring collectively to FIGS. 1-5 and step 730, the CMP process comprises a step of changing a magnitude of a downforce component that each of the plurality of downforce adjustment elements 408 locally applies to the backside plate 403 based on radial distribution of the polish rate or the polish thickness of the bottom surface portion of the substrate 41.

Generally, the process controller 50 may include a processor and a memory in communication with the process, and may be configured with processor-executable instructions to perform each and/or any of the functionalities described above. In one embodiment, the process controller 50 may be configured to determine a polish rate or a polish thickness of the bottom surface portion of the substrate 41 at each location underneath the reflection points 475 based on changes in the pixel locations 479 of the reflected laser beams 476, and may be configured to determine a magnitude of a downforce component that each of the plurality of downforce adjustment elements 408 locally applies to the backside plate 403 based on radial distribution of the polish rate or the polish thickness of the bottom surface portion of the substrate 41.

In one embodiment, the process controller 50 may be configured to locally increases the downforce at a radial distance at which the polish rate or the polish thickness of the bottom surface portion of the substrate 41 is below average, and decreases the downforce at a radial distance at which the polish rate or the polish thickness of the bottom surface portion of the substrate 41 is above average.

In one embodiment, the process controller 50 may be configured to determine a location of a center point of the respective reflected laser beams 476 by determining a respective location of an image pixel having highest detected beam intensity or by fitting an intensity distribution curve to a respective measured beam intensity distribution within the respective pixelated image sensors 478.

The hardware used to implement various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver smart objects, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more embodiments, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in a processor-executable software module or processor-executable instructions, which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage smart objects, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments without departing from the scope of the claims. Thus, the present disclosure is not intended to be limited to the embodiments shown herein but is to be accorded the widest scope consistent with the following claims and the principles and novel features disclosed herein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chemical mechanical polishing (CMP) method, comprising:

loading a substrate onto a chemical mechanical polishing (CMP) apparatus, wherein the CMP apparatus comprises a polishing pad located on a top surface of a platen, a wafer carrier that holds the substrate, and a process controller configured to control operation of components within the wafer carrier, wherein the wafer carrier comprises a backside plate configured to press the substrate on a top surface of the polishing pad, a wafer carrier frame that holds the backside plate with a cavity between a top surface of the backside plate and an inner surface of the wafer carrier frame, a plurality of downforce adjustment elements located at different radial distances from a vertical axis passing through a geometrical center of the substrate, a plurality of optical vertical displacement measurement units that includes a respective laser source configured to emit an incident laser beam onto the top surface of the backside plate at an angle of incidence that induces total reflection at a respective reflection point located at different radial distances from the vertical axis passing through the geometrical center of the substrate; and polishing a bottom surface portion of the substrate by applying downforce to the backside plate while the substrate contacts a top surface of the polishing pad and while the platen rotates, wherein the plurality of downforce adjustment elements includes a respective pixelated image sensor configured to detect a pixel location of a respective reflected laser beam derived from the incident laser beam by total reflection at the respective reflection point.

2. The CMP method of claim 1, wherein the process controller determines a polish rate or a polish thickness of a bottom surface portion of the substrate at each location underneath the reflection points based on changes in pixel locations of the respective reflected laser beams.

3. The CMP method of claim 2, further comprising changing a magnitude of a downforce component that each of the plurality of downforce adjustment elements locally applies to the backside plate based on radial distribution of the polish rate or the polish thickness of the bottom surface portion of the substrate.

4. The CMP method of claim 1, wherein the process controller is configured to automatically run an image analyzer program that determines a location of a center point of each of the respective reflected laser beams by determining a respective location of an image pixel having highest detected beam intensity.

5. The CMP method of claim 1, wherein the process controller is configured to automatically run an image analyzer program that determines a location of a center point of each of the respective reflected laser beams by fitting an intensity distribution curve to a respective measured beam intensity distribution within each of the respective pixelated image sensors.

6. The CMP method of claim 1, wherein the process controller locally increases the downforce at a radial distance at which the polish rate or the polish thickness of the bottom surface portion of the substrate is below average, and decreases the downforce at a radial distance at which the polish rate or the polish thickness of the bottom surface portion of the substrate is above average.

7. The CMP method of claim 1, wherein each of the respective pixelated image sensors comprises a complementary metal-oxide-semiconductor (CMOS) image sensor including a two-dimensional array of photodetector cells.

8. A chemical mechanical polishing (CMP) apparatus, comprising:

a polishing pad located on a top surface of a platen;

a wafer carrier that holds a substrate and facing the polishing pad;

a process controller configured with processor-executable instructions to control operation of components within the wafer carrier, wherein the wafer carrier comprises:

a backside plate configured to press the substrate on a top surface of the polishing pad;

a wafer carrier frame that holds the backside plate with a cavity between a top surface of the backside plate and an inner surface of the wafer carrier frame; and at least one optical vertical displacement measurement unit that includes a respective laser source configured to emit an incident laser beam onto the top surface of the backside plate at an angle of incidence that induces total reflection at a respective reflection point, wherein the at least one optical vertical displacement measurement unit includes at least one optical vertical displacement measurement unit includes a respective pixelated image sensor configured to detect a pixel location of a respective reflected laser beam derived from the incident laser beam by total reflection at the respective reflection point.

9. The CMP apparatus of claim 8, wherein the process controller is configured with processor-executable instructions to determine a polish rate or a polish thickness of a bottom surface portion of the substrate at each location underneath the respective reflection point based on a change in the pixel location of the respective reflected laser beam.

10. The CMP apparatus of claim 9, wherein the process controller is further configured with processor-executable instructions to determine a location of a center point of each of the respective reflected laser beam by determining a location of an image pixel having highest detected beam intensity or by fitting an intensity distribution curve to a measured beam intensity distribution.

11. The CMP apparatus of claim 8, wherein each of the at least one pixelated image sensor comprises a complementary metal-oxide-semiconductor (CMOS) image sensor including a two-dimensional array of photodetector cells.

12. The CMP apparatus of claim 8, wherein the at least one optical vertical displacement measurement unit comprises a plurality of optical vertical displacement measurement units configured to generate a plurality of reflection points located at different radial distances from a vertical axis passing through a geometrical center of the substrate.

13. The CMP apparatus of claim 12, wherein the process controller is further configured with processor-executable instructions to determine the polish rate or the polish thickness of the bottom surface portion of the substrate at each location underneath the plurality of reflection points while polishing the bottom surface portion of the substrate based on changes in pixel locations of a plurality of reflected laser beams within a respective pixelated image sensor selected from a plurality of pixelated image sensors.

14. The CMP apparatus of claim 13, wherein:

the CMP apparatus comprises a plurality of downforce adjustment elements located at different radial distances from the vertical axis passing through the geometrical center of substrate; and the process controller is further configured with processor-executable instructions to locally increase the downforce at a radial distance at which the polish rate or the polish thickness of the bottom surface portion of the substrate is below average, and to locally decrease the downforce at a radial distance at which the polish rate or the polish thickness of the bottom surface portion of the substrate is above average.

15. The CMP apparatus of claim 8, wherein:

the wafer carrier frame comprises a tubular portion and a top plate portion adjoined to a top periphery of the tubular portion;

the backside plate is configured to press the substrate such that a predominant fraction of the bottom surface portion of the substrate is flush with a horizontal plane including an annular bottom surface of the tubular portion of the wafer carrier frame; and the cavity is provided between the top surface of the backside plate and a bottom surface of the top plate portion of the wafer carrier frame, and is laterally surrounded by the tubular portion of the wafer carrier frame.

16. A chemical mechanical polishing (CMP) method, comprising:

loading a substrate onto a chemical mechanical polishing (CMP) apparatus, wherein the CMP apparatus comprises a polishing pad located on a top surface of a platen and a wafer carrier that holds the substrate, wherein the wafer carrier comprises a backside plate configured to press the substrate on a top surface of the polishing pad, a wafer carrier frame that holds the backside plate with a cavity between a top surface of the backside plate and an inner surface of the wafer carrier frame, and at least one optical vertical displacement measurement unit that includes a respective laser source configured to emit an incident laser beam onto the top surface of the backside plate at an angle of incidence that induces total reflection at a respective reflection point; and polishing a bottom surface portion of the substrate by applying downforce to the backside plate while the substrate contacts the top surface of the polishing pad and while the platen rotates, wherein the at least one optical vertical displacement measurement unit includes a respective pixelated image sensor configured to detect a pixel location of a respective reflected laser beam derived from the incident laser beam by total reflection at the respective reflection point.

17. The CMP method of claim 16, further comprising determining a polish rate or a polish thickness of the bottom surface portion of the substrate at each location underneath a respective reflection point while polishing the bottom surface portion of the substrate based on a change in the pixel location of the respective reflected laser beam.

18. The CMP method of claim 16, wherein each of the respective pixelated image sensor comprises a complementary metal-oxide-semiconductor (CMOS) image sensor including a two-dimensional array of photodetector cells.

19. The CMP method of claim 16, wherein:

the CMP apparatus comprises a process controller configured to run an image analyzer program; and the method comprises determining, through running the image analyzer program, a location of a center point of each of the respective reflected laser beam by determining a location of an image pixel having highest detected beam intensity or by fitting an intensity distribution curve to a measured beam intensity distribution.

20. The CMP method of claim 16, wherein:

each respective reflection point has an angle of incidence in a range from 75 degrees to 89.9999 degrees; and each of the incident laser beam has a wavelength in a range from 400 nm to 800 nm.

* * * * *